United States Patent [19]
Fukuda et al.

[11] Patent Number: 5,496,410
[45] Date of Patent: Mar. 5, 1996

[54] PLASMA PROCESSING APPARATUS AND METHOD OF PROCESSING SUBSTRATES BY USING SAME APPARATUS

[75] Inventors: Takuya Fukuda; Michio Ohue; Kazuo Suzuki, all of Hitachi, Japan

[73] Assignee: Hitachi, Ltd., Tokyo, Japan

[21] Appl. No.: 29,054

[22] Filed: Mar. 10, 1993

[30] Foreign Application Priority Data

Mar. 10, 1992 [JP] Japan .................................. 4-051646

[51] Int. Cl.$^6$ .................................. C23C 16/00
[52] U.S. Cl. .................. 118/723 MW; 118/713 ME; 118/723 MR; 118/723 MA; 118/724; 156/345; 204/298.38
[58] Field of Search .................. 118/723 MW, 118/723 ME, 723 MR, 723 MA, 724; 156/345; 204/298.38

[56] References Cited

U.S. PATENT DOCUMENTS

| | | | |
|---|---|---|---|
| 4,423,956 | 1/1984 | Gordon | 118/718 X |
| 4,699,805 | 10/1987 | Seelbach et al. | 118/715 X |
| 4,844,006 | 7/1989 | Page, Jr. et al. | 118/719 |
| 5,120,680 | 6/1992 | Foo et al. | 437/238 |
| 5,160,397 | 11/1992 | Doki et al. | 118/723 MR X |
| 5,211,825 | 5/1993 | Saito et al. | 118/723 MR X |

FOREIGN PATENT DOCUMENTS

| | | | |
|---|---|---|---|
| 64-21080 | 1/1989 | Japan | 118/723 MR |
| 01-236635 | 9/1989 | Japan. | |
| 04-318174 | 11/1992 | Japan. | |
| 90007578 | 2/1990 | Rep. of Korea. | |

Primary Examiner—R. Bruce Breneman
Assistant Examiner—Joni Y. Chang
Attorney, Agent, or Firm—Antonelli, Terry, Stout & Kraus

[57] ABSTRACT

In a plasma processing apparatus which forms a gaseous raw material into a plasma by using electron cyclotron resonance and processes a substrate, leading-edge opening portions of an introduction tube into which a gaseous raw material is introduced are formed in the inner wall surface of the container in such a way that they do not project within the vacuum container. A heater is wound around the introduction pipe so that the opening portions thereof can be heated. With this construction, even if a gaseous raw material which is a liquid or solid at normal temperature and normal pressure is made to flow, the gaseous raw material can be prevented from being liquefied or solidified in the opening portions of the introduction pipe, and the opening portions of the introduction pipe can be prevented from being clogged. In addition, since there are no projections within the vacuum container, the propagation of microwaves is not impeded, making it possible to uniformity process the substrate.

26 Claims, 5 Drawing Sheets

PLASMA PROCESSING APPARATUS AND METHOD OF PROCESSING SUBSTRATES BY USING SAME APPARATUS

BACKGROUND OF THE INVENTION

1. Field of the Invention

The present invention relates to a plasma processing apparatus. More particularly, the present invention relates to a plasma processing apparatus which uses materials which are either a liquid or a solid at normal temperature and normal pressure as gaseous raw materials and which is suited to form uniform, high-quality films on substrates having a large area, and to a method of processing substrates by using the apparatus.

2. Description of the Related Art

In a conventional plasma processing apparatus, treatment gas is introduced to a vacuum container through an introduction tube, and treatment gas is blown off perpendicularly to the surface of a substrate within the vacuum container in order to uniformly process a large area of the substrate, as disclosed in Japanese Patent Laid-Open No. 1-287926.

As also disclosed in Japanese Patent Laid-Open No. 1-236635, what is commonly called a microwave plasma apparatus using electron cyclotron resonance (ECR) to process high-quality thin films of oxidized film types over a large area thereof is known.

In the former plasma processing apparatus of the above-described prior art, ozone is used as a plasma seed. However, as highly excited oxygen ions are indispensable for the formation of high-quality oxidized films, there is a problem in that high-quality oxidized films cannot be formed by an apparatus using ozone as described above.

No problem arises when a gaseous raw material which is a gas at normal temperature and normal pressure is used in the latter plasma processing apparatus. However, when a gaseous raw material in which what is commonly called an aggregate (a liquid or solid at normal temperature and normal pressure) is gasified, is used, since the gaseous raw material is adiabatically expanded at the opening portion of the introduction tube and the temperature near the opening portion decreases considerably, the gaseous raw material liquefies or solidifies and is deposited on the opening portion of the introduction tube, causing the opening portion to be clogged.

Since the leading edge portion of the introduction tube projects into the vacuum container, heating may be insufficient depending upon the degree of cooling during adiabatic expansion. Therefore, the opening portion may be clogged, and the propagation efficiency of microwaves becomes poor. The substrate is not uniformly processed, decreasing processing efficiency.

SUMMARY OF THE INVENTION

An object of the present invention is to provide a plasma processing apparatus and a method of processing substrates capable of processing substrates uniformly and increasing the efficiency of the substrate processing by preventing an opening portion of an introduction tube from being clogged, and preventing microwaves from being disturbed.

To achieve the above object, according to one aspect of the present invention, there is provided a plasma processing apparatus comprising: a vacuum container in which a workpiece is placed; gas supply means for gasifying gaseous raw material which is a liquid or solid at normal temperature and normal pressure and supplying it to the vacuum container through an opening portion provided on the inner wall of the container; processing means for supplying electron cyclotron resonance to form the supplied gas into a plasma and processing the workpiece; evacuation means for maintaining the inside of the vacuum container as a vacuum; and heating means for heating an opening portion in the vicinity of the vacuum container of the gas supply means to a predetermined temperature.

According to another aspect of the present invention, there is provided a plasma processing apparatus comprising: a vacuum container in which a workpiece is placed; first gas supply means for gasifying first gaseous raw material which is liquid or solid at normal temperature and normal pressure and supplying it to the vacuum container through an opening portion provided on the inner wall of the container; second gas supply means for gasifying second gaseous raw material which is a liquid or solid at normal temperature and normal pressure and supplying it to the vacuum container through an opening portion provided on the inner wall of the container; processing means for supplying electron cyclotron resonance to form the supplied gas into a plasma and processing the workpiece; evacuation means for maintaining the inside of the vacuum container as a vacuum; and heating means for heating the opening portions in the vicinity of the vacuum containers of the first and second gas supply means to predetermined temperatures independently of each other.

According to still another aspect of the present invention, there is provided a plasma processing apparatus comprising: a vacuum container in which a workpiece is placed; gas supply means for gasifying a gaseous raw material which is a liquid or solid at normal temperature and normal pressure and supplying it to the vacuum container through an opening portion provided on the inner wall of the container; processing means for supplying electron cyclotron resonance to form the supplied gas into a plasma and processing the workpiece; evacuation means for maintaining the inside of the vacuum container as a vacuum; and heating means for heating an opening portion in the vicinity of the vacuum container of the gas supply means to a predetermined temperature.

A method of processing substrates in accordance with the present invention comprises the step of forming ferroelectric thin films or superconducting thin films on substrates by using the above-described various plasma processing apparatuses.

In an apparatus in which electron cyclotron resonance is caused by use of microwaves to form a plasma, gaseous raw material is decomposed by this plasma and a workpiece is processed, the surface on which the microwaves are propagated is the inner wall of the vacuum container. For this reason, if, for example, an object or projection of an electroconductive section is on the inner wall of the vacuum container, in particular, above or on the side of a workpiece, the propagation or mode of the microwaves is impeded or disturbed, and a uniform plasma cannot be obtained. Accordingly, if an opening portion of the gas supply means is provided on the inner wall of the vacuum container as in the present invention, the efficiency of the propagation of the microwaves increases because no projection portion is present within the vacuum container. A uniform plasma can be obtained, making it possible to uniformly process a workpiece.

As a result of an opening portion of gas supply means being heated by heating means to a predetermined temperature, even if a gaseous raw material which is a liquid or solid at normal temperature and normal pressure is made to flow, the gaseous raw material does not liquefy or solidify, making it possible to prevent the opening portion from being clogged and to process a workpiece more uniformly. In this case, the opening portion must be heated to at least above the solidifying point of the gaseous raw material.

When different types of gaseous raw materials are supplied to a vacuum container in order to process a workpiece, the mixing of these gaseous raw materials must be sometimes avoided. Accordingly, ordinarily, a plurality of opening portions are provided on the inner wall of a vacuum container. Different types of gaseous raw materials can be introduced from the plurality of opening portions. In a plasma processing apparatus constructed as described above, if heating means for heating the opening portions is provided, and if a plurality of opening portions are controlled independently of each other by the heating means, the mixing of gaseous raw materials can be avoided, and meticulous temperature control in accordance with the type of gaseous raw material can be performed.

In oxide type ferroelectric thin film formation or superconducting thin film formation, the supplying of highly excited oxygen plasma seeds is important, and most of the raw materials are aggregates. Since highly excited oxygen plasma can be obtained by a plasma generation method in which electron cyclotron resonance is used, high-quality ferroelectric or superconducting thin films can be efficiently and uniformly processed .over a large area of a substrate by use of the plasma processing apparatus.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DESCRIPTION OF THE PREFERRED EMBODIMENTS

Preferred embodiments of the present invention will be explained below with reference to the accompanying drawings.

First Embodiment

Figure 1:
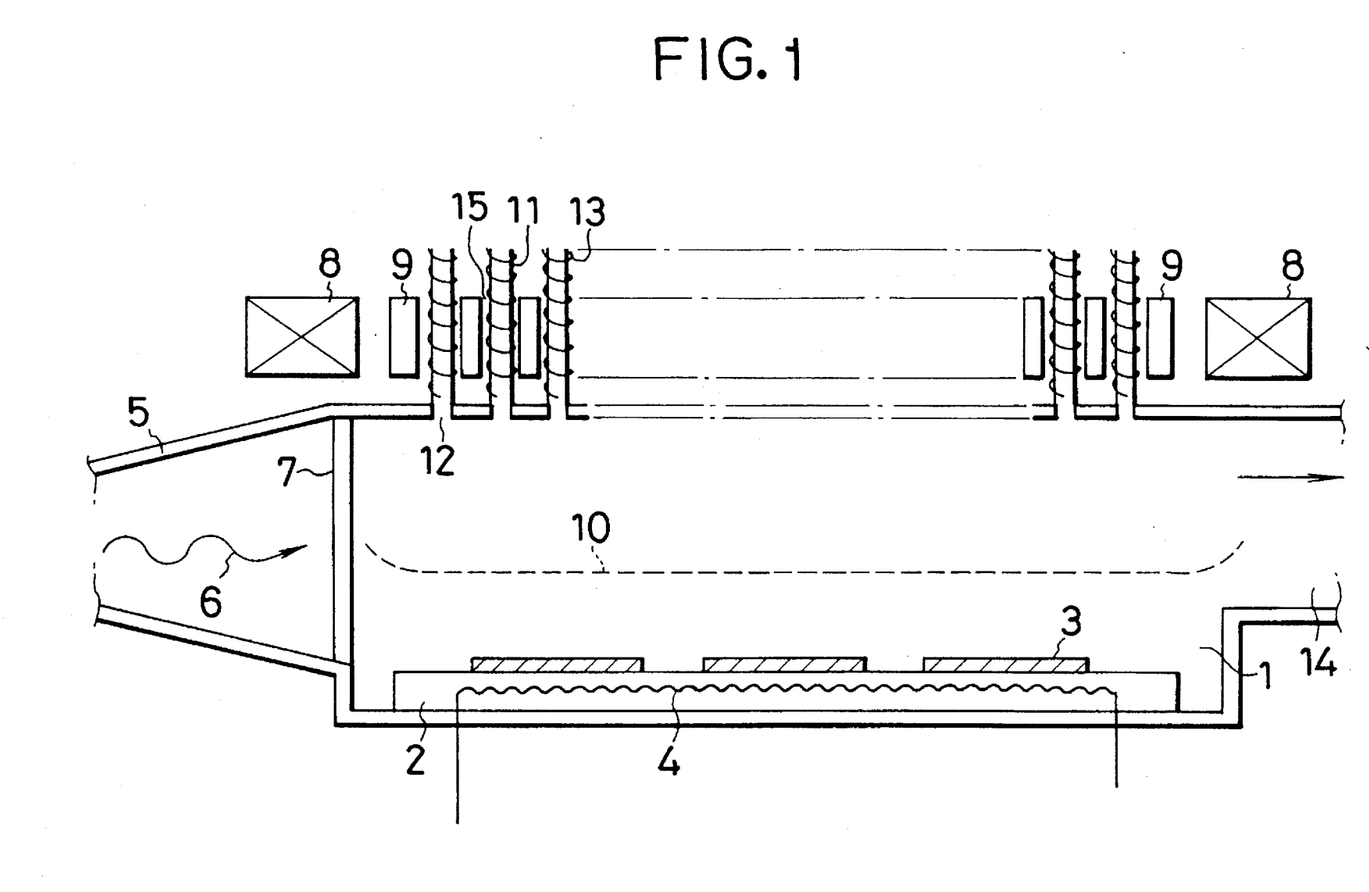
FIG. 1 is a schematic illustration of the construction of a plasma processing apparatus in accordance with a first embodiment of the present invention.

FIG. 1 illustrates a schematic construction of a microwave plasma processing apparatus which processes substrates by using microwaves in accordance with a first embodiment of the present invention. As shown in FIG. 1, a substrate holder 2 is provided within a vacuum container 1, and a substrate 3 is placed on the substrate holder 2. The substrate holder 2 incorporates a heater 4 therein, which heats the substrate 3 on the substrate holder 2. A microwave waveguide 5 is provided on a side (the left side of FIG. 1) of the vacuum container 1, which microwave waveguide 5 is connected to an unillustrated magnetron. Microwaves 6 from the magnetron are introduced to the microwave waveguide 5 and introduced into the vacuum container 1 through an introduction window 7.

A magnetic-field coil 8 and an iron core 9 are provided in the upper section of the vacuum container 1, making it possible to generate a magnetic field for inducing electron cyclotron resonance (hereinafter referred to as ECR) within the vacuum container 1. An opening portion 12 of an introduction pipe 11 is formed on the inner wall of the vacuum container 1. The introduction tube 11 is used to supply substrate processing raw materials which are aggregates and gases, such as oxygen, at normal temperature and normal pressure, into the vacuum container 1. A heater 13 for heating the opening portion 12 is wound around the introduction tube 11.

Figure 2:
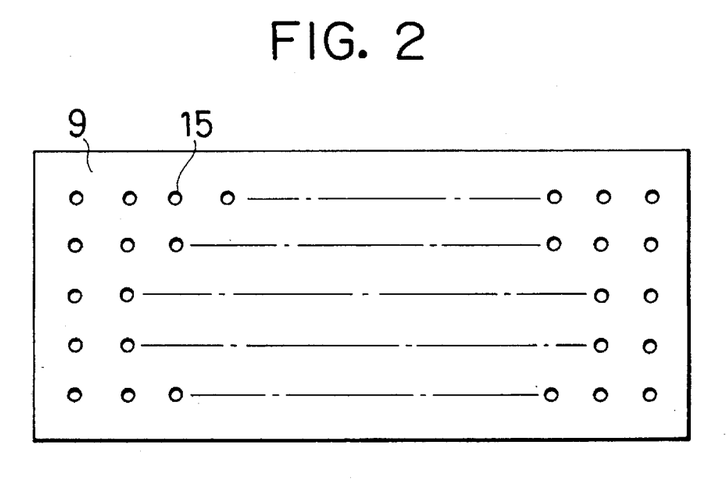
FIG. 2 is a top plan view of the iron core shown in FIG.

An evacuation slot 14 is provided on the other side (the right side of FIG. 1) of the vacuum container 1. This evacuation slot 14 is connected to an evacuation system, such as an evacuation pump (not shown). The iron core 9 is constructed as shown in FIG. 2 when seen from the top side of the apparatus. There are a great number of holes 15 for permitting the introduction tube 11 to pass therethrough.

According to the plasma processing apparatus constructed as described above, since the opening portion 12 of the introduction tube 11 is provided on the inner wall surface of the vacuum container 1 and the leading edge portion of the introduction tube 11 does not project into the vacuum container 1, heat from the heater 13 is transferred adequately to the opening portion 12. Thus, the gaseous raw material does not get clogged in the opening portion 12, and the microwaves are not reflected thereby.

Figure 3:
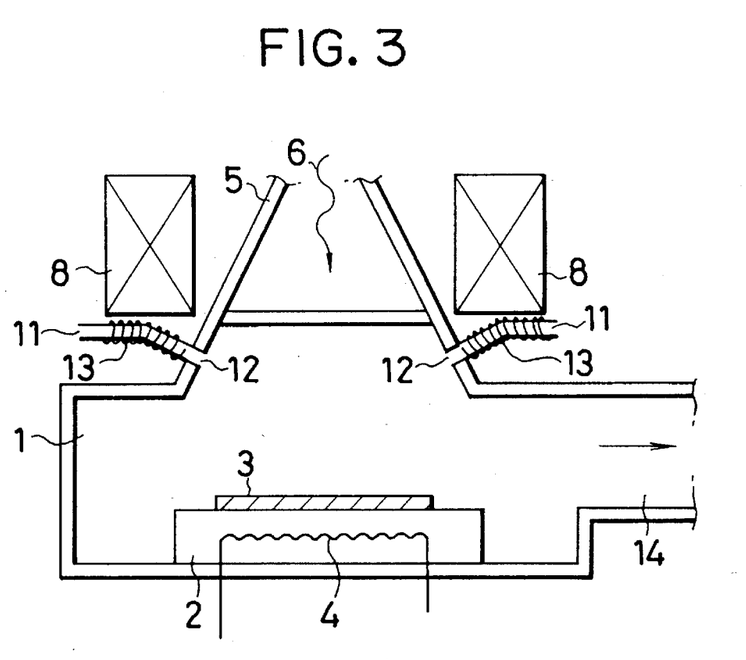
FIG. 3 is a schematic illustration of the construction of a plasma processing apparatus according to a modification of the first embodiment.

FIG. 3 illustrates a modification of the microwave plasma processing apparatus. As shown in FIG. 3, a substrate 3 is placed perpendicularly to the direction in which the microwaves 6 are introduced. The introduction tube 11 for supplying raw material used to process a substrate, oxygen or the like into the vacuum container 1 is provided obliquely to the substrate 3. In the same way as in FIG. 1, the heater 13 is wound around the introduction tube 11 and the opening portion 12 thereof is formed on the inner wall surface of the vacuum container 1.

Figure 4:
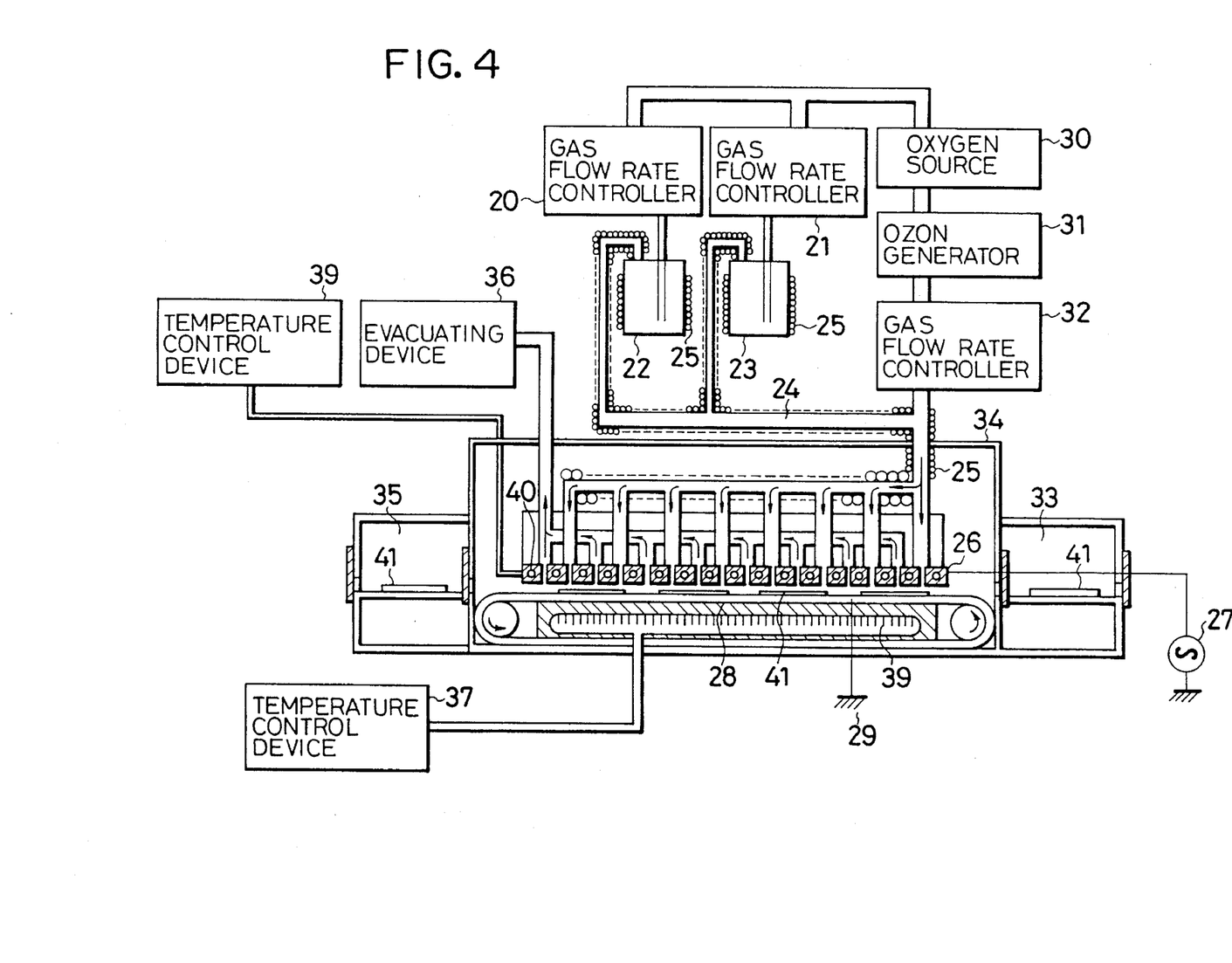
FIG. 4 is a schematic illustration of the construction of a plasma processing apparatus according to a conventional plasma processing apparatus.

Next, a processing apparatus shown in FIG. 4 was manufactured, and comparative experiments were carried out to examine the processing characteristics of thin film formation by the plasma processing apparatus shown in FIGS. 1 and 3. The plasma processing apparatus of FIG. 4 imitates from the apparatus disclosed in Japanese Patent Laid-Open No. 1-287926 with the exception that the following are added for this experiment. Added are a gas introduction system comprising gas flow rate controllers 20 and 21, tanks 22 and 23, and a supply tube 24; a heater 25 for heating the tanks 22 and 23 and the supply tube 24; a power supply 27 for applying radio waves (frequency: 13.6 MHz) to a gas outlet discharge portion 26; and a grounding 29 for a metallic belt 28.

The other components are the same as those disclosed in the above Publication. Reference numeral 30 denotes an oxygen supply source; reference numeral 31 denotes an ozone generator; reference numeral 32 denotes a gas flow rate controller; reference numeral 33 denotes a carry-in chamber; reference numeral 34 denotes a processing chamber; reference numeral 35 denotes a take-out chamber; reference numeral 36 denotes an evacuation device; reference numerals 37 and 38 denote temperature controllers; reference numerals 39 and 40 denote heaters; and reference numeral 41 denotes a substrate.

The details of the experiment will be explained below.

A silicon wafer having a diameter of 125 mm was used as a substrate 41. After a thermal oxide film having a thickness of 100 nm was formed on the silicon wafer, platinum (Pt) was formed into a thickness of 100 nm. As for raw materials, tetraether lead ($Pb(C_2H_5)_4$) was used as lead, titanium tetraisopropoxide ($Ti(i-OC_3H_7)_4$) was used as titanium, and oxygen ($O_2$) was used for carrier gas as shown in FIG. 4, so that a lead titanate ($PbTiO_3$) film was formed.

The results obtained by examining the above-mentioned processing characteristics are shown below by designating when the film was formed by using the apparatus of FIG. 1 as <<C>> and when the film was formed by using the apparatus of FIGS. 3 and 4 as <<B>> and <<A>>, respectively.

Heating of the raw material source, the heating temperature Te of the tube, the substrate temperature Ts, the introduced microwave power PM per unit area were the same in <<B>> and <<C>>. The pressure when the lead titanate film was formed was 1.0 Pa in <<B>> and <<C>>, and 100 Pa in <<A>>. Other conditions were: Te=100° C., Ts=400° C., PM=0.2 W/cm$^2$.

In the case of <<A>>, an experiment was carried out by a conventional method in which high frequency is not applied initially.

Although a film was formed, the objective $PbTiO_3$ could not be formed because the composition of the film was $PbTiO_x$ (x=1 to 2.2). Observation of the surface of the film with an electron microscope showed that only a very porous film was formed. Considering that $O_3$ alone is insufficient as a plasma seed, a high frequency of 13.6 MHz was applied at 0.2 W/cm$^2$ to the gas outlet discharge portion 26 and a film was formed while an oxygen plasma was being caused. At this time, no changes were observed in the electron density of the plasma, the electron temperature of the plasma and the plasma light-emission spectrum even if $O_3$ was made to flow or $O_2$, in the same amount as $O_3$, was made to flow. Therefore, the experiment was carried out in such a way that no $O_3$ was made to flow, that is, the ozone generator 31 was stopped, and $O_2$ was introduced from the oxygen supply source 30 through the ozone generator 31 into the processing chamber 34. A film having a composition closer to a desired composition could be obtained with an average composition of the formed film being $PbTiO_x$ (x=2.0 to 3.0).

The film formation speed DR was 1 nm/min on average, the speed distribution Dw within the substrate showed a distribution with the center forming a convex projection, the difference between the center of the substrate and the end portion thereof was 40% of the average speed, a variation DL between the first substrate and the last substrate when batch processing was performed 25 times was 33% of the average speed at 25 times of batch processing. A variation Sw of the content of Ti with respect to Pb in the center of the filmy substrate was 17% different from that in the end portion of the filmy substrate. The maximum error SL for 25 times of batch processing was 10%.

In the case of <<B>>, $PbTiO_3$ with a stoichiometric composition could be formed with $PbTiO_x$ (x=3.0). The film formation speed DR was 65 nm/min, the speed distribution Dw within the substrate <30%, DL<25%, Sw<1%, and SL<3%. The plasma state in <<A>> and <<B>> was examined by probe measurement and light-emission spectrum measurement. The electron density was 7×10$^8$/cm$^3$ for <<A>>, and 2×10$^{11}$/cm$^3$ for <<B>>. Though the 0 radical (wavelength: 440 nm) during film formation was the same for <<A>> and <<B>>, $O_2$+ ions (wavelength: 560 nm) intensity in <<B>> was 10 times stronger than that in <<A>>. That is, it was shown that the higher the plasma density and the larger the excited $O_2$+ ions, a film of a stoichiometric composition can be formed and the speed of the formation thereof increases considerably. It can be seen from this experiment that a CVD method using ECR plasma is effective at least in the formation of ferroelectric films.

In the case of <<C>>, despite the fact that the flow rate of the gaseous raw material to be introduced is not changed and the number of substrates to be processed is great, DR>67 nm/min, Dw<5%, DL<5%, Sw<1%, and SL<3%. The difference between <<B>> and <<C>> is that a plurality of opening portions of the introduction tube are provided above the substrate, and the raw material is blown off uniformly and substantially perpendicularly to the surface of the substrate. A comparison between <<B>> and <<C>> shows that a great amount of substrates can be uniformly processed if a substrate is placed parallel to the direction in which microwaves are introduced and the raw material is blown off substantially perpendicularly to the substrate without impeding the propagation of the microwaves above the substrate.

Second Embodiment

Figure 5:
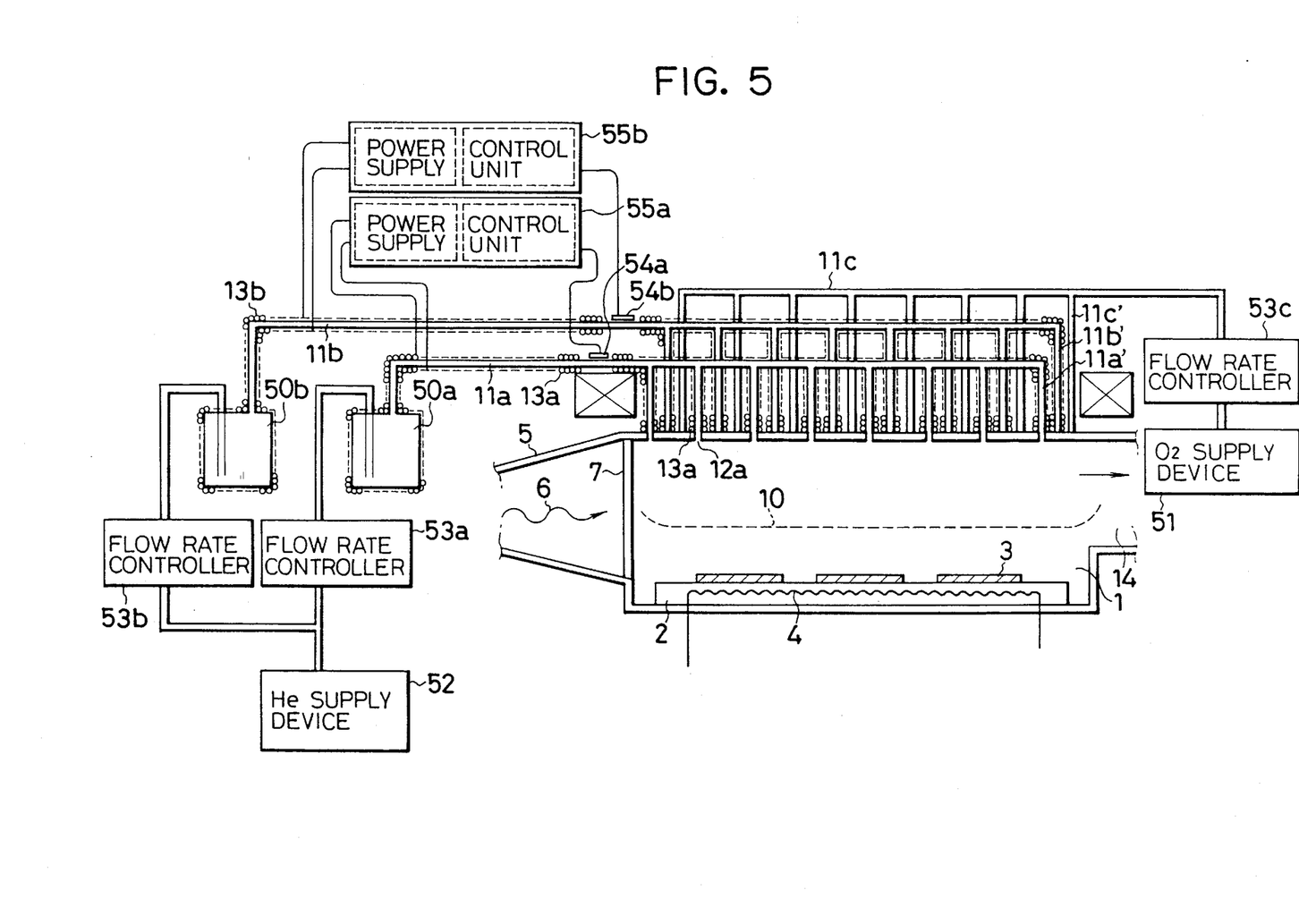
FIG. 5 is a schematic illustration of the construction of a plasma processing apparatus in accordance with a second embodiment of the present invention.

In the apparatus shown in FIG. 1, the number of the holes 15 of the iron core 9 of FIG. 2 was increased from 5×13 to 78×72, with this increase the introduction tube 11 was divided into three independent systems, and the number of the opening portions 12 was made to be 72×72. The construction of the plasma processing apparatus of the second embodiment including a gas supply system is shown in FIG. 5. A Pb source is supplied from a first source supply device 50a and a Ti source is supplied from a second supply device 50b. $O_2$ is supplied from an $O_2$ supply device 51 (specifically, an $O_2$ supply device having a pressure reducing valve mounted on a 10-litter bomb). The Pb source and the Ti source are supplied from a He supply device 52 (specifically, a He supply device having a pressure reducing valve mounted on a 10-litter bomb) and transported to introduction tubes 11a and 11b by He the amount of which is controlled by flow rate controllers 53a and 53b. $O_2$ is introduced from the $O_2$ supply device 51 into a flow rate controller 53c where the flow rate of $O_2$ is controlled and supplied to an introduction tube 11c. The source transported to the introduction tubes 11a, 11b and 11c is transported to 26×24 of the introduction tubes 11a', 11b' and 11c' (shown in 1×8 in the figure), and introduced into the vacuum container 1 through the opening portion 12.

The first and second source supply devices 50a and 50b, the introduction tubes 11a' and 11b', and the opening portions of the introduction tubes 11a' and 11b' are heated by heaters 13a and 13b, respectively. The heating is separated into the following two systems and controlled.

① First source supply device 50a'—introduction tube 11a—introduction tube 11a'—opening portion of the introduction tube 11a'

② Second source supply device 50b—introduction tube 11b—introduction tube 11b'—opening portion of the introduction tube 11b'

When the heating of the system ① is controlled, temperature information detected by a temperature sensor 54a (specifically a thermocouple) provided in the introduction tube 11a is sent to a temperature controller 55a. The temperature controller 55a processes the temperature information by the control section thereof, and the amount of electricity supplied to the heater 13a is adjusted by a power supply provided within the temperature controller 55a. Also in the case of the system ②, temperature information from the temperature sensor 54b is sent to the temperature controller 55b where heating control is performed in the same manner as above. Although temperature controllers are provided within the temperature controllers 55a and 55b, an illustration thereof is omitted.

Figure 6:
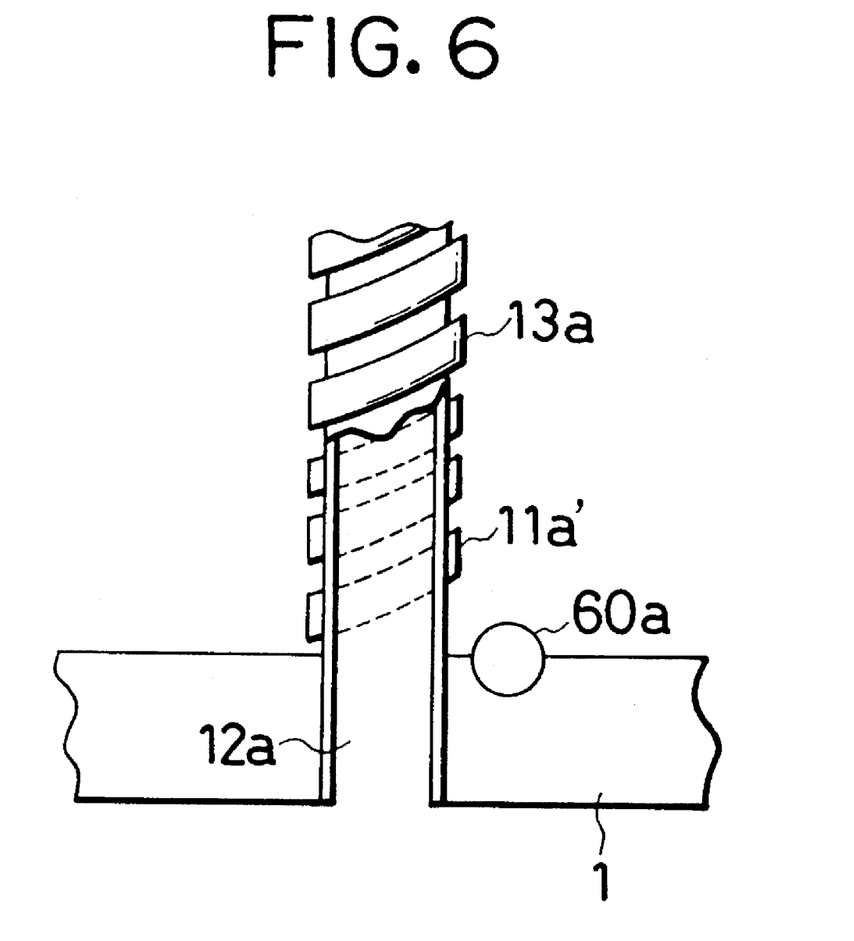
FIG. 6 is an enlarged view of the vicinity of an opening portion of an introduction tube.

The vicinity of the opening portions of the introduction tubes 11a' and 11b' is shown in detail in FIG. 6. For example, a temperature sensor 60a is buried in the wall of the vacuum container in the vicinity of the opening portion 12a of the introduction tube 11a', making it possible to detect the temperature of the opening portion 12a. A heater (tape heater) 13a is wound around the introduction tube 11a' as described above. The opening portion of the introduction tube 11b' is provided similarly to that described above.

In the systems ① and ②, placement temperature differs depending upon a source used. Sources used for forming $PbTiO_3$ films, source temperature, pipe temperature, opening portion temperature are shown in Table 1 below.

TABLE 1

| Source Name | Chemical Formula | Source Temperature [°C] | Pipe Temperature [°C] | Opening Temperature [°C] |
|---|---|---|---|---|
| Pb source | $Pb(C_2H_5)_4$ | 35 | 55 | 65 |
|  | $Pb(DPM)_2$ | 200 | 220 | 230 |
| Ti source | $Ti(OC_2H_5)_4$ | 32 | 52 | 62 |
|  | $Ti(i-OC_3H_7)_4$ | 82 | 102 | 112 |
|  | $Ti(DPM)_4$ | 120 | 140 | 150 |

DPM:  $C_{11}H_{14}O_2$

Next, an example in which $Pb(C_2H_5)_4$ and $Ti(i-OC_3H_7)_4$ are used will be described. Though in the first embodiment $Pb(C_2H_5)_4$ carried by oxygen gas, $Ti(i-OC_3H_7)_4$, and oxygen were mixed and introduced uniformly into the vacuum container 1 through 5×13 opening portions via the introduction tube 11, each raw material source is introduced into the vacuum container 1 without being mixed in this embodiment. Also in this embodiment, He carrier gas is adjusted so that the net amounts of $Pb(C_2H_5)_4$ and $Ti(i-OC_3H_7)_4$ become respectively the same as those in the first embodiment. A $PbTiO_3$ film was formed with the other conditions being the same as in the first embodiment.

If the case of this embodiment is designated by <<D>>, though the results of forming the $PbTiO_3$ film showed no significant differences in the film formation speed and distribution, the examination of the growth state on the basis of X-ray analysis of the formed $PbTiO_3$ film showed that only a peak of a perovskite structure could be observed in <<D>> whereas a pyrochlore structure could be observed in <<C>>. That is, this reveals that the crystallinity of the formed film increases considerably if the raw material source is controlled independently and introduced into the vacuum container without being mixed and made to react.

Next, $PbTiO_3$ was formed by using $Pb(C_2H_5)_4$ as a Pb source and $Ti(DPM)_4$ as a Ti source, both of which are shown in Table 1. When the $PbTiO_3$ film was formed at temperatures set as shown in Table 1, $PbTiO_3$ having excellent crystallinity as described earlier could be obtained.

However, when the Pb introduction pipe temperature and the opening portion temperature were set at the set temperature of $Ti(DPM)_4$, that is, the pipe temperature was set at 102° C. and the opening portion temperature was set at 112° C., a decomposed reaction by-product was observed in the opening portion into which $Pb(C_2H_5)_4$ was introduced. Therefore, desired $PbTiO_3$ could not be obtained, and the opening portion got clogged. Therefore, it is shown that the temperature of the source introduction system is preferably controlled independently depending upon a source used.

Third Embodiment

A capacitor film was formed by using the cases of <<A>> and <<C>> shown in the first embodiment and the case of <<D>> shown in the second embodiment. The area of the capacitor was set at 0.3×4.0 μm², and the film thickness was set considering the magnitude of the average dielectric constants obtained by the respective methods of the above embodiments, so that the capacity of the capacitor was adjusted. The yield of manufacturing DRAMs in this case will be shown below. For the sake of a comparison, the yield was set at 100% in steps other than the step for forming capacitor thin films. The yield was approximately equal to 0% in <<A>>, was 45% in <<C>>, and 92% in <<D>>. This indicates that the present invention makes it possible to manufacture what cannot be manufactured by a conventional substrate processing method, and that the manufacturing yield can be increased more when more consideration is given to the nature of a raw material source and the characteristics of the processing method of the plasma processing apparatus.

Although a $PbTiO_3$ film has been shown as an example in the above embodiment, the same effects can be obtained if the present invention is applied to cases of other high- and ferro-electric substances, such as $Pb(Zr, Ti)O_3$, $(Pb, La)(Zr, Ti)O_3$, $BaTiO_3$, or $SrTiO_3$, by extending the source supply and introduction system.

Fourth Embodiment

A superconducting material was formed by using organic metals of Ba, Pb, Sr, Ca, and Cu as raw material sources and by using cases of <<A>> and <<C>> shown in the first embodiment and the case of <<D>> of the second embodiment. However, Te and Ts are different from the metals of the first and second embodiments. The results of X-ray analysis showed that only a solid solution whose composition cannot be controlled was formed in <<A>>, slight crystalinity was observed in <<C>>, and in <<D>> it was observed that a crystal had grown and the lattice constant of the C axis was 37 Å. This reveals that it is important that heating up to the proximity of the vacuum container be performed in the formation of superconducting thin films, and the introduction tubes be separated into a plurality of independent groups in accordance with the types of raw materials, and that a plurality of types of raw materials be introduced into the vacuum container through the plurality of independent groups without mixing the plurality types of raw materials and the heating thereof be controlled independently of each other.

The present invention has the same effect in the formation of other superconducting films or films having other material or composition structures.

Fifth Embodiment

A $SiO_2$ film was formed by using tetraoxoethoxysilane $(Si(OC_2H_5)_4$: hereinafter referred to as TEOS), an organic chemical of Si, in accordance with the method of <<C>> shown in the first embodiment and the method of <<D>> of the second embodiment. As regards the supplying of a source, TEOS was put in place of a Pb source and He was introduced into the processing chamber as a carrier gas in <<C>>. In this case, TEOS was mixed with $O_2$ gas supplied from the oxygen supply source before it was introduced into the vacuum container and introduced into the processing chamber. Also, in <<D>>, TEOS was added to the Pb source, i.e., the first source supply source 50a, and the source temperature was set at 70° C. and the temperature of the pipe and the opening portion was set at 100° C. as in <<C>>. The net amount of TEOS and the amount of oxygen to be introduced into the vacuum container were the same in <<C>> and <<D>>. The other conditions were the same as in the first and second embodiments.

A point of difference between <<C>> and <<D>> is that in <<C>> oxygen to be supplied is heated and mixed with TEOS before it is introduced into the vacuum container, whereas oxygen is not heated or mixed with TEOS before it is introduced into the vacuum container in <<D>>.

Snowy $SiO_2$ films, in addition to solid $SiO_2$ films, were formed in spots on the substrate in <<C>>. A great amount of snowy films were deposited around the opening portion. No snowy films described above were formed and no depositions were observed in <<D>>. To investigate the cause of this drawback, the $O_2$ introduction system (11c, 11c' in the figure) was heated to 100° C., and the $SiO_2$ film was formed in the method of <<D>>. This case is designated by <<D'>>.

Although formation of snowy films on the substrate was not observed in <<C>>, a deposition was observed around the opening portion, though the amount thereof was decreased in <<D'>>. This reveals that snowy films are reaction by-products of heated $O_2$ and TEOS. Since the difference between <<D>> and <<D'>> is whether oxide has been heated to the same temperature as that of TEOS and introduced, no objectionable film deposits will occur within the vacuum container if the TEOS and oxygen systems are controlled independently of each other as in <<D>>. Since the difference between <<D>> and <<C>> is whether heated oxide is mixed before it is introduced into the vacuum container, there is an advantage in that an objectionable reaction, such as objectionable film formation, is not caused if the TEOS and oxygen systems are introduced into the vacuum container independently of each other as in <<D>>.

Although examples in which only thin films are formed have been described in the above-described embodiments, needless to say, the present invention has the same effect on substrate processing using aggregate raw materials at normal temperature and normal pressure, for example, substrate surface modification, etching or doping.

According to the present invention, as described above, since plasma having a great amount of excited oxygen ions can be used, an oxide film with a stoichiometric composition can be formed. Furthermore, since opening portions of introduction tubes are formed on the inner wall surface of a vacuum container, the temperature of the opening portions can be reliably controlled. Even if a raw material is used which is an aggregate at normal temperature and normal pressure, the raw material can be prevented from being clogged in the opening portions, thus increasing the uniformity and reliability of substrate processing. In addition, since the opening portions of the introduction tubes are formed in the inner wall surface of the vacuum container, there are no projections inside the vacuum container, and efficiency of the propagation of microwaves increases. The uniformity and efficiency of substrate processing increases in a microwave plasma apparatus.

Since a plurality of opening portions may be provided on the inner wall surface of the vacuum container above a substrate, and since a raw material may be introduced perpendicularly to the substrate, the uniformity and efficiency of substrate processing can be increased even more. Furthermore, since a plurality of introduction tubes may be provided in accordance with the type of raw material used, and since different types of raw materials may be introduced into the vacuum container separately through the plurality of introduction tubes and the temperature of the opening portions of the introduction tubes can be controlled independently of each other, the processing characteristics of substrate processing can be made uniform and the yield can be increased.

In a microwave plasma apparatus, by making an improvement from a method in which a substrate is placed perpendicularly to the direction in which microwaves are propagated to a method in which the substrate is processed with it placed parallel to the propagation of the microwaves, a large area of the substrate can be made uniform and the iron core of a coil can be placed above the substrate. As a result, coil current can be reduced, and a magnetic field can be applied uniformly to the surface of the substrate.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included with the spirit and scope of the claims. The following claims are to be accorded the broadest interpretation, so as to encompass all such modifications and equivalent structures and functions.

What is claimed is:

1. A plasma processing apparatus, comprising:

a vacuum container in which a workpiece is placed;

gas supply means for gasifying a liquid or solid raw material and for supplying the gasified liquid or solid raw material to the vacuum container through an opening portion provided in an inner wall of the containers, the gas supply means including gas supply structure and said opening portion, none of the gas supply means extending into the container;

processing means for subjecting the supplied gas to electron cyclotron resonance conditions to form a plasma therefrom;

evacuation means for maintaining the inside of the vacuum container at a vacuum condition; and heating means for heating said gas supply structure and said opening portion of the gas supply means including in a vicinity of the vacuum container.

2. A plasma processing apparatus according to claim 1, wherein the gas supply means has a plurality of opening portions provided in the vicinity of said vacuum container, and the gas supply means is positioned such that gas flow through all the opening portions is provided perpendicularly to a surface of said workpiece exposed to the plasma.

3. A plasma processing apparatus according to claim 1, wherein said processing means has magnetic-field generating means for inducing electron cyclotron resonance and microwave guide means.

4. A plasma processing apparatus, comprising:

a vacuum container in which a workpiece is placed;

first gas supply means for gasifying a first liquid or solid raw material and supplying the gasified liquid or solid raw material to the vacuum container through an opening portion provided in an inner wall of the container, the first gas supply means including gas supply structure and said opening portion, none of the first gas supply means extending into the container;

second gas supply means for gasifying a second liquid or solid raw material and supplying the gasified liquid or solid raw material to the vacuum container through an opening portion provided in the inner wall of the container, the second gas supply means including gas supply structure and said opening portion;

processing means for subjecting the supplied gas to electron cyclotron resonance conditions, to form a plasma therefrom;

evacuation means for maintaining the inside of the vacuum container at a vacuum condition; and heating means for independently heating the gas supply structure and opening portions of both the first and second gas supply means including in a vicinity of the vacuum container, to temperatures independent of each other.

5. A plasma processing apparatus according to claim 4, wherein the first and second gas supply means have a plurality of opening portions provided in the vicinity of said vacuum container, and the first and second gas supply means are positioned such that gas flow through all the opening portions is provided perpendicularly to a surface of said workpiece exposed to the plasma.

6. A plasma processing apparatus according to claim 4, wherein said processing means has magnetic-field generating means for inducing electron cyclotron resonance and microwave guide means.

7. A plasma processing apparatus, comprising:

a vacuum container in which a workpiece is placed;

gas supply means for gasifying a plurality of liquid or solid raw materials and supplying the gasified liquid or solid raw materials to the vacuum container through an opening portion provided in an inner wall of the container, the gas supply means including gas supply structure and said opening portion, the gas supply means terminating at the inner wall of the container, none of the gas supply means extending into the container;

processing means for subjecting the supplied gas to electron cyclotron resonance conditions to form a plasma therefrom;

evacuation means for maintaining the inside of the vacuum container at a vacuum condition; and heating means for heating the gas supply structure and the opening portion of the gas supply means including in the vicinity of the vacuum container.

8. A plasma processing apparatus according to claim 7, wherein the gas supply means has a plurality of opening portions provided in the vicinity of said vacuum container, and the gas supply means is positioned such that gas flow through all the opening portions is provided perpendicularly to a surface of said workpiece exposed to the plasma.

9. A plasma processing apparatus according to claim 7, wherein said processing means has magnetic-field generating means for inducing electron cyclotron resonance and microwave guide means.

10. A plasma processing apparatus, comprising:

a vacuum container in which a workpiece is placed;

first gas supply means for supplying a first gaseous raw material to the vacuum container through an opening portion provided in an inner wall of the container, the first gas supply means terminating at the inner wall of the container, none of the first gas supply means extending into the container;

second gas supply means for gasifying a liquid or solid second raw material and supplying the gasified second raw material to the vacuum container through a second opening portion provided in the inner wall of the container, the second gas supply means including gas supply structure and said second opening portion;

processing means for subjecting the supplied gas to electron cyclotron resonance conditions to form a plasma therefrom;

evacuation means for maintaining the inside of the vacuum container at a vacuum condition; and heating means for heating the gas supply structure and second opening portion of the second gas supply means including in the vicinity of the vacuum container.

11. A plasma processing apparatus according to claim 4, wherein the second gas supply means terminates at the inner wall of the container, none of the second gas supply means extending into the container.

12. A plasma processing apparatus according to claim 10, wherein the second gas supply means terminates at the inner wall of the container, none of the second gas supply means extending into the container.

13. A plasma processing apparatus according to claim 1, wherein the processing means includes a means for introducing microwaves into the container, and the means for introducing microwaves introduces the microwaves into the container in a direction parallel to a surface of the workpiece to be processed by the plasma processing apparatus.

14. A plasma processing apparatus according to claim 1, wherein the processing means includes a means for introducing microwaves into the container, wherein the means for introducing microwaves introduces the microwaves into the container in a direction perpendicular to a surface of the workpiece to be processed by the plasma processing apparatus, and wherein the gas supply means is positioned so as to supply the gasified liquid or solid raw material in a direction oblique to said surface.

15. A plasma processing apparatus, comprising:

a vacuum container in which a workpiece is to be placed;

gas supply means for gasifying a liquid or solid raw material so as to form an obtained gas;

a gas guide tube for leading the obtained gas from the gas supply means into the vacuum container through an opening portion provided in an inner wall of the vacuum container, the gas guide tube having a first part, and a leading end which is attached in alignment with the inner wall of the vacuum container;

processing means for forming the obtained gas into a plasma by subjecting the obtained gas to electron cyclotron resonance conditions;

evacuation means for maintaining the inside of the vacuum container at a vacuum condition; and heating means for heating the gas flowing through the first part and the leading end of the gas guide tube, including the gas reaching the opening portion, the heating means extending to the opening portion.

16. A plasma processing apparatus, comprising:

a vacuum container in which a workpiece is to be placed;

first gas supply means for gasifying a first liquid or solid raw material so as to form a first obtained gas;

a first gas guide tube for leading the first obtained gas from the first gas supply means into the vacuum container through an opening portion provided in an inner wall of the vacuum container, the first gas guide tube having a first portion and having a leading end attached in alignment with the inner wall of the vacuum container;

second gas supply means for gasifying a second liquid or solid raw material so as to form a second obtained gas;

a second gas guide tube for leading the second obtained gas from the second gas supply means into the vacuum container through an opening portion provided in the inner wall of the container, the second gas guide tube having a first portion and having a leading end attached in alignment with the inner wall of the vacuum container;

processing means for respectively forming the gases supplied from the first and second gas supply means into plasmas by subjecting the gases to electron cyclotron resonance conditions;

evacuation means for maintaining the inside of the vacuum container at a vacuum condition; and heating means for separately heating the supplied gases flowing through the first portions and leading ends of the first and second gas guide tubes, including the gases reaching the respective opening portions, the heating means extending to the opening portions.

17. A plasma processing apparatus, comprising:

a vacuum container in which a workpiece is to be placed;

first gas supply means for supplying a first gas;

a first gas guide tube for leading the gas supplied from the first gas supply means into the vacuum container through an opening portion provided in an inner wall of the vacuum container, a leading end of the first gas guide tube being attached in alignment with the inner wall of the vacuum container;

second gas supply means for gasifying a raw liquid or solid material so as to form an obtained gas;

a second gas guide tube for leading the gas supplied from the second gas supply means into the vacuum container through an opening portion provided on the inner wall of the vacuum container, the second gas guide tube having a first portion and having a leading end attached in alignment with the inner wall of the vacuum container;

processing means for forming the gases supplied from the first and second gas supply means into a plasma by subjecting the gases supplied from the first and second gas supply means to electron cyclotron resonance conditions;

evacuation means for maintaining the inside of the vacuum container at a vacuum condition; and heating means for heating the supplied gas flowing through the first portion and the leading end of the second gas guide tube, including the gas reaching the opening portion, the heating means extending to the opening portion.

18. A plasma processing apparatus according to claim 1, wherein said gas supply structure extends from a source of the liquid or solid material to said opening portion.

19. A plasma processing apparatus according to claim 4, wherein the gas supply structures of the first and second gas supply means each extend from respective sources of the first and second liquid or solid raw materials to respective opening portions.

20. A plasma processing apparatus according to claim 7, wherein said gas supply structure extends from a source of the liquid or solid raw materials to said opening portions.

21. A plasma processing apparatus according to claim 10, wherein the gas supply structure of the second gas supply means extends from a source of the liquid or solid second raw material to the opening portion.

22. A plasma processing apparatus, comprising:

a vacuum container in which a workpiece is placed;

gas supply means for gasifying a liquid or solid raw material and for supplying the gasified liquid or solid raw material to the vacuum container through an opening portion provided in an inner wall of the container, none of the gas supply means extending into the container, wherein the gas supply means has a plurality of opening portions provided in the vicinity of said vacuum container, and the gas supply means is positioned such that gas flow through all the opening portions is provided perpendicularly to a surface of said workpiece exposed to the plasma;

processing means for subjecting the supplied gas to electron cyclotron resonance conditions to form a plasma therefrom;

evacuation means for maintaining the inside of the vacuum container at a vacuum condition; and heating means for heating an opening portion of the gas supply means in a vicinity of the vacuum container.

23. A plasma processing apparatus, comprising:

a vacuum container in which a workpiece is placed;

first gas supply means for gasifying a first liquid or solid raw material and supplying the gasified liquid or solid raw material to the vacuum container through an opening portion provided in an inner wall of the container, none of the first gas supply means extending into the container;

second gas supply means for gasifying a second liquid or solid raw material and supplying the gasified liquid or solid raw material to the vacuum container through an opening portion provided in the inner wall of the container;

wherein the first and second gas supply means have a plurality of opening portions provided in the vicinity of said vacuum container and the first and second gas supply means are positioned such that gas flow through all the opening portions is provided perpendicularly to a surface of said workpiece exposed to the plasma;

processing means for subjecting the supplied gas to electron cyclotron resonance conditions, to form a plasma therefrom;

evacuation means for maintaining the inside of the vacuum container at a vacuum condition; and heating means for independently heating the opening portions of the first and second gas supply means in a vicinity of the vacuum container, to temperatures independent of each other.

24. A plasma processing apparatus, comprising:

a vacuum container in which a workpiece is placed;

gas supply means for gasifying a plurality of liquid or solid raw materials and supplying the gasified liquid or solid raw materials to the vacuum container through an opening portion provided in an inner wall of the container, the gas supply means terminating at the inner wall of the container, none of the gas supply means extending into the container, wherein the gas supply means has a plurality of opening portions provided in the vicinity of said vacuum container, and the gas supply means is positioned such that gas flow through all the opening portions is provided perpendicularly to a surface of said workpiece exposed to the plasma;

processing means for subjecting the supplied gas to electron cyclotron resonance conditions to form a plasma therefrom;

evacuation means for maintaining the inside of the vacuum container at a vacuum condition; and heating means for heating the opening portions of the gas supply means in the vicinity of the vacuum containers.

25. A plasma processing apparatus, comprising:

a vacuum container in which a workpiece is placed;

gas supply means for gasifying a liquid or solid raw material and for supplying the gasified liquid or solid raw material to the vacuum container through an opening portion provided in an inner wall of the container, none of the gas supply means extending into the container;

processing means for subjecting the supplied gas to electron cyclotron resonance conditions to form a plasma therefrom, wherein the processing means includes a means for introducing microwaves into the container, and the means for introducing microwaves introduces the microwaves into the container in a direction parallel to a surface of the workpiece to be processed by the plasma processing apparatus;

evacuation means for maintaining the inside of the vacuum container at a vacuum condition; and heating means for heating an opening portion of the gas supply means in a vicinity of the vacuum container.

26. A plasma processing apparatus, comprising:

a vacuum container in which a workpiece is placed;

gas supply means for gasifying a liquid or solid raw material and for supplying the gasified liquid or solid raw material to the vacuum container through an opening portion provided in an inner wall of the container, none of the gas supply means extending into the container;

processing means for subjecting the supplied gas to electron cyclotron resonance conditions to form a plasma therefrom, wherein the processing means includes a means for introducing microwaves into the container, wherein the means for introducing microwaves introduces the microwaves into the container in a direction perpendicular to a surface of the workpiece to be processed by the plasma processing apparatus, and wherein the gas supply means is positioned so as to supply the gasified liquid or solid raw material in a direction oblique to said surface;

evacuation means for maintaining the inside of the vacuum container at a vacuum condition; and heating means for heating an opening portion of the gas supply means in a vicinity of the vacuum container.

* * * * *